United States Patent
Koehler et al.

(10) Patent No.: US 9,580,610 B2
(45) Date of Patent: Feb. 28, 2017

(54) ALUMINIUM OXIDE PASTES AND PROCESS FOR THE USE THEREOF

(75) Inventors: Ingo Koehler, Reinheim (DE); Oliver Doll, Dietzenbach (DE); Werner Stockum, Reinheim (DE); Sebastian Barth, Darmstadt (DE)

(73) Assignee: MERCK PATENT GMBH, Darmstadt (DE)

(*) Notice: Subject to any disclaimer, the term of this patent is extended or adjusted under 35 U.S.C. 154(b) by 99 days.

(21) Appl. No.: 14/003,467

(22) PCT Filed: Feb. 9, 2012

(86) PCT No.: PCT/EP2012/000592
§ 371 (c)(1),
(2), (4) Date: Sep. 6, 2013

(87) PCT Pub. No.: WO2012/119686
PCT Pub. Date: Sep. 13, 2012

(65) Prior Publication Data
US 2014/0000481 A1    Jan. 2, 2014

(30) Foreign Application Priority Data

Mar. 8, 2011  (EP) ..................................... 11001921
Sep. 6, 2011  (EP) ..................................... 11007205

(51) Int. Cl.
*C09D 7/12* (2006.01)
*H01L 21/22* (2006.01)
*C23C 18/12* (2006.01)
*C09D 1/00* (2006.01)
*C09D 5/00* (2006.01)

(52) U.S. Cl.
CPC ............. *C09D 7/1216* (2013.01); *C09D 1/00* (2013.01); *C09D 5/006* (2013.01); *C09D 7/1233* (2013.01); *C23C 18/1216* (2013.01); *C23C 18/1245* (2013.01); *C23C 18/1254* (2013.01); *H01L 21/2225* (2013.01)

(58) Field of Classification Search
None
See application file for complete search history.

(56) References Cited

U.S. PATENT DOCUMENTS

2008/0090101 A1  4/2008  Klipp et al.
2009/0189510 A1  7/2009  Kanamori et al.
(Continued)

FOREIGN PATENT DOCUMENTS

CN   101679807 A    3/2010
EP     1156024 A1  11/2001
(Continued)

OTHER PUBLICATIONS

International Search Report for PCT/EP2012/000592 (Jun. 28, 2013).
(Continued)

*Primary Examiner* — Colin W Slifka
(74) *Attorney, Agent, or Firm* — Millen White Zelano and Branigan, PC; Csaba Henter; Anthony Zelano

(57) ABSTRACT

The present invention relates to aluminium oxide pastes and to a process for the use of the aluminium oxide pastes for the formation of $Al_2O_3$ coatings or mixed $Al_2O_3$ hybrid layers.

20 Claims, 2 Drawing Sheets

(56) References Cited

U.S. PATENT DOCUMENTS

Figure 1:
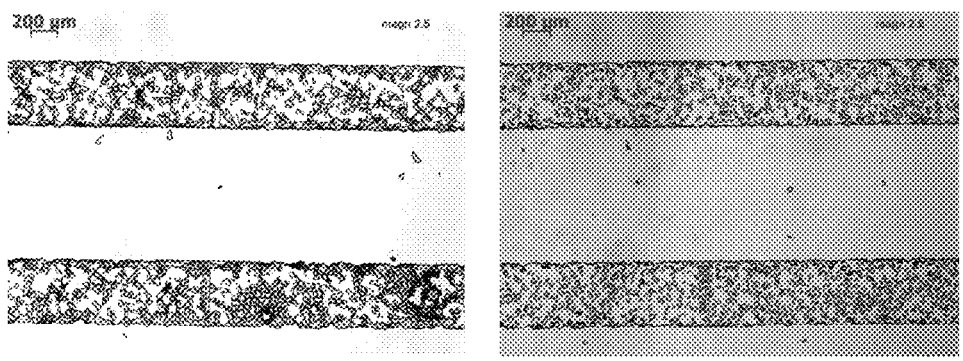

| | | |
|---|---|---|
| 2010/0243221 A1 | 9/2010 | Yamasaki et al. |
| 2011/0076505 A1* | 3/2011 | Ishii .......................... C23C 8/10 428/472 |

FOREIGN PATENT DOCUMENTS

| | | |
|---|---|---|
| EP | 2085411 A2 | 8/2009 |
| EP | 2147957 A1 | 1/2010 |
| JP | 06-19129 A | 7/1994 |
| JP | 2010-254553 A | 11/2010 |
| TW | 200819506 A | 5/2008 |
| TW | 200936717 A | 9/2009 |

OTHER PUBLICATIONS

L. Montanaro et al., "Set up of a Screen-Printing Procedure for the Production of a β Alumina-Based Gas Sensor", Journal of Electroceramics, vol. 5, No. 3 (2000) pp. 253-259.

L. Jiang et al., "Adsorption of Salicylic Acid, 5-Sulfosalicylic Acid and Tiron at the Alumina-Water Interface", Colloids and Surfaces A: Physicochem. Eng. Aspects, vol. 211, No. 2-3 (Dec. 1, 2002) pp. 165-172.

P.C. Hidber et al., "Influence of the Dispersant Structure on Properties of Electrostatically Stabilized Aqueous Alumina Suspensions", Journal of the European Ceramic Society, vol. 17, No. 2 (1997) pp. 239-249.

N. Ozer et al., "Preparation of Amorphous Al2O3 Films by the Sol-Gel Process", Part of the SPIE Conference on Solar Optical Materials XVI, SPIE vol. 3789 (Jul. 1999) pp. 77-83.

M. Nocun et al., "Sodium Diffusion Barrier Coatings Prepared by Sol-Gel Method", Optica Applicata, vol. 38, No. 1 (2008) pp. 171-179.

Chinese Office Action dated May 15, 2015 issued in corresponding CN 201280011955.6 application (pp. 1-12).

English Abstract of JPH 06-191929 A published Jul. 12, 1994.

English Abstract of JP 2010-254553 A published Nov. 11, 2010.

\* cited by examiner

ALUMINIUM OXIDE PASTES AND PROCESS FOR THE USE THEREOF

The present invention relates to aluminium oxide pastes and to a process for the use of the aluminium oxide pastes for the formation of $Al_2O_3$ coatings or mixed $Al_2O_3$ hybrid layers.

The synthesis of sol-gel-based layers is attaining ever-greater importance in industrial production owing to their variety of possible uses. Thus, the following functional layers or surface finishes and modifications can be built up or carried out by means of sol-gel technology:

antireflection coatings, for example for optical components and the like
corrosion-protection coatings, for example of steels and the like
scratch-protection coatings
surface seals
hydrophobisation or hydrophilisation of surfaces
synthesis of membranes and membrane materials
synthesis of support materials for catalytic applications
precursors of sinter ceramics and sinter-ceramic components
dielectric layers for electronic and microelectronic components having the following special applications, where the formation of one of the desired functionalities may be, but does not have to be, linked to specific heat treatment, such as, for example, in a stream of $O_2$, $N_2$, $O_2/N_2$ and/or forming gas:
  spin-on-glass ("SoG") in the manufacture of integrated circuits
  dielectric buffer layers between individual metallisation planes in the manufacture of integrated circuits ("porous MSQ")
  printable dielectric layers for printed circuits, printable electronics in general and printable organic electronics in particular
diffusion-barrier layers (cf. MERCK SolarResist patent)
  for semiconductors in general
  for silicon in particular and especially for silicon wafers and in particular for those for the production of crystalline silicon solar cells
matrices for the binding of dopants (for example B, Ga, P, As, etc.) for the specific full-area and/or local doping of semiconductors in general
  silicon in particular and especially for silicon wafers and in particular for those for the production of crystalline silicon solar cells
electronic passivation of semiconductor surfaces in general and of silicon surfaces in particular, which results in a considerable reduction in the surface recombination speed.

This list only represents a selection of the various possible applications.

Most sol-gel processes known from the literature are based on the use of silicon and alkoxides thereof (siloxanes), the specific hydrolysis and condensation of which enables networks having various properties and coatings which can be derived therefrom to be synthesised very easily, and smooth or porous films, or films in which particles are embedded, can be produced in this way. For certain applications, however, it would be desirable to be able to provide coatings having improved properties compared with conventional silicon dioxide layers, such as higher hardness and modified behaviour towards etchants generally employed.

By means of a number of experiments, it has been found that the use of $Al_2O_3$ in corresponding layers enables a highly promising replacement for $SiO_2$ layers to be obtained. Besides the above-mentioned uses, in which $Al_2O_3$ serves either as diffusion barrier and/or sol-gel-based doping source, $Al_2O_3$ is also suitable, owing to the hardness of its crystalline modifications, for use as mechanical protection layer.

Surprisingly, it has now been found that it is possible to synthesise and formulate paste-form mixtures based on the $Al_2O_3$ sol-gel process which meet the rheological requirements of the screen-printing process. Unexpectedly, the paste-form mixtures can be applied surprisingly easily to silicon wafer surfaces in the screen-printing process, where they have high structure fidelity.

For use, in particular in the solar sector, sol-gel-based layers have to meet particular requirements, and thus so too do the pastes based on them, meaning that these requirements also have to be taken into account in the formulation of compositions for the production of such layers.

On the one hand, suitable solvents having properties which are advantageous for the use, such as, for example, no to low toxicity, adequate surface wetting, etc., should be selected. Furthermore, corrosive anions ($Cl^-$ or $NO_3^-$, etc.) should not be present in the pastes, since they would greatly limit the possible uses of the pastes. Corresponding pastes could, for example, corrode the printing and deposition equipment used, but also later undesirably promote corrosion of solder contacts when connecting up solar cells which are provided with such layers, which would consequently result in limited long-term stability of crystalline silicon solar cells.

For the production of screen-printable pastes, the literature only discloses syntheses using rheological additives or grinding of metal oxides precipitated by the sol-gel process with subsequent suspension of these oxides. However, this type of paste production with post-treatment or admixture of rheological additives usually comprises contamination of the actual active substances.

Zhou et al. have investigated, for example, the synthesis of a $Cu_2ZnSnS_4$ paste. Elemental copper, zinc, tin and sulfur were ground in a ball mill with addition of ethanol. After subsequent drying, these were suspended in isopropanol and mixed with a 10% ethylcellulose mixture in isopropanol. This mixture was ground again in a ball mill with addition of terpineol, and the alcohol was removed in vacuo. The resultant viscous mass was employed for screen printing, and the layers obtained were investigated. {[1] Z. Zhou, Y. Wang, D. Xu, Y. Zhang, Solar Energy Materials and Solar Cells, in press, (2010)}

Hansch et al. in turn investigated the synthesis of a screen-printable $Y_2O_3/ZrO_2$ mixed oxide. A $Y_2O_3/ZrO_2$ sol was obtained by mixing zirconium n-propoxide stabilised by means of acetylacetone and carboxylic acid (acetic acid, propionic acid, caproic acid, nonanoic acid) in isopropanol and an aqueous yttrium nitrate solution. In order to obtain a screen-printable paste, a calcined $Y_2O_3/ZrO_2$ powder was added to this sol (sol/powder 20/80-40/60 wt. %), and this mixture was subsequently ground by means of a ball mill for homogenisation. In the same way, pastes were prepared with addition of organic additives (terpineol or ethylcellulose), but a paste was also prepared only from the calcined oxide. These pastes were investigated for their suitability as electrolytic layer in fuel cells. {[2] R. Hansch, M. R. R. Chowdhury, N. H. Menzler, Ceramics International, 35 (2009), 803-811}

Laobuthee et al. obtained an $MgAl_2O_4$ (spinel) paste by mixing a ground ($K^+$- or $Na^+$-doped) $MgAl_2O_4$ powder formed from a sol-gel synthesis with organic additives (butylcarbitol acetate, terpineol, ethylcellulose). This paste was applied to aluminium oxide substrates by means of screen printing. The layers obtained in this way were investigated for their suitability as atmospheric moisture sensors. {[3] A. Laobuthee, N. Koonsaeng, B. Ksapabutr, M. Panapoy, C. Veranitisagul, International Journal of Materials & Structural Reliability, 3 (2005), 95-103}

Riviere et al. at tempted to optimise a classical $SnO_2$ screen-printing paste wit h inorganic thickeners and organic "vehicles" (solvent s) and to prepare a "gel ink", which consists only of active $SnO_2$ ($SnO_2$ gel obtained from sol-gel systems with admixture of $SnO_2$ powder). These two compositions were investigated with respect to their suitability as CO sensor. The inks without addition of organic and inorganic additives exhibited significantly higher sensor activity after heat treatment at 600° C. {[4] B. Riviere, J. -P. Viricelle, C. Pijolat, Sensors and Actuators B, 93 (2003), 531-537}

After the classical sol-gel process, there is no stable state between sol (low viscosity <100 mPas) and gel (high viscosity >100 Pas) for the production of $Al_2O_3$ layers. The literature only mentions stabilised sols or high-viscosity gels for the formation of aluminium oxide fibres.

Dressler et al. added ASB (Al tri-sec-butoxide) to an aqueous solution of aluminium nitrate. At high ASB concentrations, phase separation (2-butanol phase and aqueous phase) occurred. Polyvinylpyrrolidone was therefore added as binder. The rheology of the resultant sols and the chemical structure were investigated by means of NMR, and the correlating particle sizes were measured. {[5] M. Dressler, M. Nofz, J. Pauli, C. Jäger, Journal of Sol-Gel Science and Technology (2008) 47, 260-267}

Furthermore, Glaubitt et al. modified ASB firstly by means of glycol ether and subsequently by means of propionic acid. After addition of 0.5 mol of water per mol of aluminium, the viscosity increased rapidly (>2000 Pas), while a clear sol(/gel) remained. The gel exhibited long stability, and long fibres could be drawn therefrom. The sol was investigated by means of $^{27}$Al-NMR before each modification, and the drying was investigated by means of TGA. {[6] W. Glaubitt, D. Sporn, R. Jahn, Journal of Sol-Gel Science and Technology, 2 (1994), 525-528}

Shojaie-Bahaabad et al. in t urn investigated the formation of $Y_2O_3/Al_2O_3$ (YAG) sols. Yttrium oxide was dissolved in aqueous HCl. $AlCl_3$ and slowly aluminium powder were added to this solution. This solution was heated at 98° C. for 6 h in order to dissolve the aluminium powder. The sol obtained was investigated rheologically for its gel behaviour as a function of the Al powder to $AlCl_3$ content and the $Y_2O_3$ and $H_2O/HCl$ content. Fibres were spun from the gels ($\eta$>2000 Pas), and these were investigated by means of SEM and XRD. {[7] M. Shojaie-Bahaabad, E. Taheri-Nassaj, R. Naghizadeh, Ceramics International, 34 (2008), 1893-1902}

Object:

The object of the present invention is therefore to develop and stabilise a screen-printable aluminium oxide paste while avoiding interfering, highly corrosive anions, such as, for example, chloride and nitrate, and further rheological additives, which can result in the introduction of further impurities, where the long-term stability of the paste should simultaneously be retained.

Subject-Matter of the Invention

The object is achieved by the use of printable, sterically stabilised pastes for the formation of $Al_2O_3$ coatings and also mixed $Al_2O_3$ hybrid layers. Pastes according to the invention comprise precursors for the formation of $Al_2O_3$ and one or more oxides of the elements selected from the group boron, gallium, silicon, germanium, zinc, tin, phosphorus, titanium, zirconium, yttrium, nickel, cobalt, iron, cerium, niobium, arsenic and lead, where the pastes are obtained by the introduction of corresponding precursors into the paste.

Preference is given to the use of sterically stabilised pastes which are obtained by mixing with at least one hydrophobic component and at least one hydrophilic component and optionally with at least one chelating agent. Furthermore, these pastes comprise at least one hydrophobic component selected from the group 1,3-cyclohexadione, salicylic acid and structurally related compounds, and at least one hydrophilic compound selected from the group acetylacetone, dihydroxybenzoic acid and trihydroxybenzoic acid or structurally related compounds thereof, chelating agents, such as ethylenediaminetetraacetic acid (EDTA), diethylenetriaminepentaacetic acid (DETPA), nitrilotriacetic acid (NTA), ethylenediaminetetramethylene-phosphonic acid (EDTPA) and diethylenetriaminepentamethylenephosphonic acid (DETPPA) or structurally related complexing agents or corresponding chelating agents. Besides these components, the pastes used comprise solvents selected from the group of low-boiling alcohols, preferably selected from the group ethanol and isopropanol, and at least one high-boiling solvent selected from the group of high-boiling glycol ethers, preferably selected from the group diethylene glycol monoethyl ether, ethylene glycol monobutyl ether and diethylene glycol monobutyl ether or mixtures thereof, and optionally polar solvents selected from the group acetone, DMSO, sulfolane and ethyl acetate, or similar polar solvents. Particularly advantageous is the use according to the invention of corresponding pastes which have an acidic pH in the range 4-5 and comprise, as acids, one or more organic acids, preferably acetic acid, which result in residue-free drying. Particular preference is given to the use of these pastes for the formation of impermeable, homogeneous layers, to which water for hydrolysis is added in the molar ratio of water to precursor in the range from 1:1 to 1:9, preferably between 1:1.5 and 1:2.5, where the solids content is in the range 9 to 10% by weight. In particular, these pastes can be used for the production of a diffusion barrier, a printed dielectric, electronic and electrical passivation, an antireflection coating, a mechanical protection layer against wear or a chemical protection layer against oxidation or the action of acid. These pastes are furthermore suitable for the preparation of hybrid materials comprising simple and polymeric boron and phosphorus oxides and alkoxides thereof for the full-area and local doping of semiconductors, preferably silicon, or for the production of $Al_2O_3$ layers as sodium and potassium diffusion barriers in LCD technology.

The present invention also relates, in particular, to a process for the production of pure, residue-free, amorphous $Al_2O_3$ layers on mono- or multicrystalline silicon wafers, sapphire wafers, thin-film solar modules, glasses coated with functional materials (for example ITO, FTO, AZO, IZO or the like), uncoated glasses, steel elements and alloys, and on other materials used in microelectronics, in which, after application of the paste, the drying is carried out at temperatures between 300 and 1000° C., preferably at 300 to 400° C., particularly preferably at 350° C.

Drying and heat treatment of the printed-on pastes at temperatures from 1000° C. forms hard, crystalline layers having comparable properties to corundum.

Application of a suitable amount of paste per unit area gives, over the course of a drying time of less than minutes, a layer thickness of less than 100 nm. The process according to the invention preferably enables pure, residue-free, amorphous, structurable Al2O3 layers to be produced if, after application of a thin layer of paste, the drying is carried out at temperatures between 300 and 500° C. Correspondingly produced layers which have been dried at temperatures <500° C. can be etched by most mineral acids, but preferably by HF and $H_3PO_4$, and by many organic acids, such as acetic acid or propionic acid, or post-structured.

Surprisingly, experiments have shown that it is possible to synthesise and formulate paste-form mixtures based on the $Al_2O_3$ sol-gel process which meet the rheological requirements of the screen-printing process and can thus be found precisely in the viscosity window which is described above and has hitherto not been acquired/occupied. Unexpectedly, the paste-form mixtures can be deposited, for example on silicon wafer surfaces, by means of the screen-printing process on the one hand surprisingly easily and on the other hand very well with retention of high structure fidelity, corresponding to the screen definition or characteristic used for printing, as shown by the examples given below. Corresponding aluminium oxide pastes form impermeable, i.e. diffusion-impermeable or -resistant, smooth layers on the surface of silicon wafers. This means that, on combined drying and heat treatment at below 400° C., the pastes formed by a sol-gel process form stable and smooth layers which are free from organic contaminants after drying and heat treatment.

The present invention thus relates to acidic, sterically stabilised $Al_2O_3$ pastes having a pH in the range 4-5, preferably having a pH<4.5, which comprise sterically stabilised $Al_2O_3$ precursors with small amounts of polyoxylated solvents having very good wetting and adhesion properties on $SiO_2$- and silane-terminated silicon wafer surfaces, and which result in the formation of homogeneous, impermeable, in particular diffusion-impermeable, layers.

FIG. 1 shows a photomicrograph of an $Al_2O_3$ layer according to the invention which has been applied by screen printing to a polished (100) silicon wafer and has a layer thickness of 600 nm at the crown. It is apparent to the person skilled in the art that the achievable layer thickness is variable through suitable and careful selection and setting of characteristic parameters of the paste used and through the choice of the screen used for the printing process.

Correspondingly, FIG. 1 shows in the present case a photomicrograph of a screen-printed $Al_2O_3$ layout after drying for 5 minutes at 300° C. (left) and after 10 minutes at 600° C. (right). The very good resolution of the line (printed: 500 µm, after drying: 500 µm) is evident. The splinters within the screen-printed layer presumably arise through bursting of the layer with a thickness of about 600 nm.

The aluminium sols can be formulated using corresponding alkoxides of aluminium as precursors. These can be aluminium triethoxide, aluminium triisopropoxide and aluminium tri-sec-butoxide. Alternatively, readily soluble hydroxides and oxides of aluminium can be employed. All organic aluminium compounds which are suitable for the formation of $Al_2O_3$ in the presence of water under acidic conditions at a pH in the range from about 4-5 are suitable per se as precursors in paste formulations.

Corresponding alkoxides are preferably dissolved in a suitable solvent mixture. This solvent mixture may be composed both of polar protic solvents and also polar aprotic solvents, and mixtures thereof. In addition and in accordance with the pre-specified application conditions, the solvent mixtures can be adapted within broad limits by the addition of non-polar solvents, for example in order to influence their wetting behaviour. Suitable polar protic solvents can be:

aliphatic, saturated and unsaturated, mono- to polybasic, functionalised and non-functionalised alcohols, such as methanol, ethanol, propanol, butanol, amyl alcohol, propargyl alcohol and homologues having C≤10 such as alkylated, secondary and tertiary alcohols with any desired degree of branching, for example iso-propanol, 2-butanol, isobutanol, tert-butanol and homologues, preferably isopropanol and 2-butanol such as glycol, pinacols, 1,2-propanediol, 1,3-propanediol, 1,2,3-propanetriol and further branched homologues such as monoethanolamine, diethanolamine and triethanolamine glycol ethers and condensed glycol ethers, and propylene glycol ethers and condensed propylene glycol ethers, and branched homologues thereof, such as methoxyethanol, ethoxyethanol, propoxyethanol, butoxyethanol, pentoxyethanol, phenoxyethanol and others diethylene glycol, diethylene glycol monomethyl ether, diethylene glycol monoethyl ether, diethylene glycol monopropyl ether, diethylene glycol monobutyl ether, diethylene glycol monopentyl ether, diethylene glycol dimethyl ether, diethylene glycol diethyl ether, diethylene glycol dipropyl ether, diethylene glycol dibutyl ether, diethylene glycol dipentyl ether and others propylene glycol, methoxy-2-propanol, propylene glycol monomethyl ether, propylene glycol dimethyl ether, propylene glycol monoethyl ether, propylene glycol diethyl ether, phenoxypropylene glycol and others.

Suitable polar aprotic solvents can be:

dimethyl sulfoxide, sulfolane, 1,4-dioxane, 1,3-dioxane, acetone, acetyl-acetone, dimethylformamide, dimethylacetamide, ethyl methyl ketone, diethyl ketone and others.

In the case of the use of aluminium alkoxides, the synthesis of the sol furthermore requires the addition of water in order to achieve hydrolysis for the formation of the aluminium nuclei and precondensation thereof. The water required can be added in sub- to superstoichiometric amounts. Substoichiometric addition is preferred.

The alkoxides liberated on hydrolysis of the aluminium nuclei are converted into the corresponding alcohols by addition of an organic acid and/or mixtures of organic acids. The acid or acid mixture is added in such a way that a pH in the range between 4-5, preferably <4.5, can be achieved. In addition, the added acid and/or acid mixture acts as catalyst for the precondensation and crosslinking commencing therewith of the aluminium nuclei hydrolysed in the solution. Suitable organic acids can be:

formic acid, acetic acid, acetoacetic acid, trifluoroacetic acid, mono-chloro- to trichloroacetic acid, phenoxyacetic acid, glycolic acid, pyruvic acid, glyoxylic acid, oxalic acid, propionic acid, chloropropionic acid, lactic acid, β-hydroxypropionic acid, glyceric acid, valeric acid, trimethylacetic acid, acrylic acid, methacrylic acid, vinylacetic acid, crotonic acid, isocrotonic acid, glycine and further α-amino acids, β-alanine, malonic acid, succinic acid, maleic and fumaric acid, malic acid, tartronic acid, mesoxalic acid, acetylenedicarboxylic acid, tartaric acid, citric acid, oxalacetic acid, benzoic acid, alkylated and halogenated, nitrated and hydroxylated benzoic acids, such as salicylic acid, and further homologues The stabilisation of the aluminium sol can be carried out either by means of the above-mentioned organic acids and mixtures thereof, or alternatively achieved or increased by the specific addition of complexing and/or chelating additives. Complexing agents for aluminium which can be used are the following substances:

nitrilotriacetic acid, nitrilotris(methylenephosphonic acid). ethylene-diaminetetraacetic acid, ethylenediaminetetrakis(methylenephos-phonic acid), diethylene glycol diaminetetraacetic acid, diethylene-triaminepentaacetic acid, diethylene glycol triaminetetrakis(methylene-phosphonic acid), diethylenetetraminepentakis(methylenephosphonic acid), triethylene-tetraminehexaacetic acid, triethylenetetraminehexakis(methylene-phosphonic acid), cyclohexanediaminetetraacetic acid, cyclohexanediaminetetrakis(methylenephosphonic acid), etidronic acid, imino-diacetic acid, iminobis(methylenephosphonic acid), hexamethylene-diaminetetrakis(methylenephosphonic acid), methyliminodiacetic acid, methyliminobis(methylenephosphonic acid), dimethyliminoacetic acid, dimethyliminomethylenephosphonic acid, hydroxyethyliminodiacetic acid, hydroxyethylethylenediaminetetraacetic acid, trimethylene-dinitrilotetraacetic acid, 2-hydroxytrimethylenedinitrilotetraacetic acid, maltol, ethylmaltol, isomaltol, kojic acid, mimosine, mimosinic acid, mimosine methyl ether, 1,2-dimethyl-3-hydroxy-4-pyridinone, 1,2-diethyl-3-hydroxy-4-pyridinone, 1-methyl-3-hydroxy-4-pyridinone, 1-ethyl-2-methyl-3-hydroxy-4-pyridinone, 1-methyl-2-ethyl-3-hydroxy-4-pyridinone, 1-propyl-3-hydroxy-4-pyridinone, 3-hydroxy-2-pyridinones, 3-hydroxy-1-pyridinethiones, 3-hydroxy-2-pyridinethiones, lactic acid, maleic acid, D-gluconic acid, tartaric acid, 8-hydroxyquinoline, catechol, 1,8-dihydroxynaphthalene, 2,6-dihydroxynaphthalene, naphthalic acid (naphthalene-1,8-dicarboxylic acid), 3,4-dihydroxynaphthalene, 2-hydroxy-1-naphthoic acid, 2-hydroxy-3-naphthoic acid, dopamine, L-dopa, desferal or desferriferrioxamine-B, acetonehydroxamic acid, 1-propyl- and 1-butyl- and 1-hexyl-2-methyl-3-hydroxy-4-pyridinone, 1-phenyl- and 1-p-tolyl- and 1-p-methoxy-phenyl and 1-p-nitrophenyl-2-methyl-3-hydroxy-4-pyridinone, 2-(2'-hydroxyphenyl)-2-oxazoline, 2-(2'-hydroxyphenyl)-2-benzoxazole, 2, X-dihydroxybenzoic acid (where X=3, 4, 5, 6), other alkylated, halogenated, nitrated 2,X-dihydroxybenzoic acids, salicylic acid and alkylated, halogenated and nitrated derivatives thereof, such as 4-nitro- and 5-nitrosalicyic acid, 3,4-dihydroxybenzoic acid, other alkylated, halogenated, nitrated 3,4-dihydroxybenzoic acids, 2,3,4-trihydroxybenzoic acid, other alkylated, halogenated, nitrated 2,3,4-trihydroxybenzoic acids, 2,3-dihydroxyterephthalic acid, other alkylated, halogenated, nitrated 2,3-dihydroxyterephthalic acids, mono-, di- and trihydroxyphthalic acids, and other alkylated, halogenated, nitrated derivatives thereof, 2-(3', 4'-dihydroxyphenyl)-3,4-dihydro-2H-1-benzopyran-3,5,7-triol (componentfrom tannin), malonic acid, oxydiacetic acid, oxal-acetic acid, tartronic acid, malic acid, succinic acid, hippuric acid, glycolic acid, citric acid, tartaric acid, acetoacetic acid, ethanolamines, glycine, alanine, β-alanine, alaninehydroxamic acid, α-aminohydroxamic acids, rhodotorulic acid, 1,1',1"-nitrilo-2-propanol, N,N-bis (2-hydroxyethyl)glycine, bis(2-hydroxyethyl)iminotris(hydroxymethyl)-methane, N-(tris(hydroxymethyl)methyl)glycine, ethylenediaminetetra-2-propanol, N,N-bis(2-hydroxyethyl)-2-aminoethanesulfonic acid, N-(tris(hydroxymethyl)methyl)-2-aminoethanesulfonic acid, pentaerythritol, N-butyl-2,2'-iminodiethanol, monoethanolamine, diethanolamine, triethanolamine, acetylacetone, 1,3-cyclohexanedione.

Furthermore, it is possible to employ substituted (for example alkylated, halogenated, nitrated, sulfonated, carboxylated) homologues and derivatives of the above-mentioned complexing and chelating agents, and salts thereof, preferably ammonium salts and complexing and chelating agents which are able to coordinate Al.

Furthermore, further additives can be added to the aluminium sol for specific setting of desired properties, which can be, for example, surface tension, viscosity, wetting behaviour, drying behaviour and adhesion capacity. Such additives can be:

surfactants and surface-active compounds for influencing the wetting and drying behaviour, antifoams and deaerating agents for influencing the drying behaviour, further high- and low-boiling polar protic and aprotic solvents for influencing the particle-size distribution, the degree of precondensation, the condensation, wetting and drying behaviour and the printing behaviour, further high- and low-boiling non-polar solvents for influencing the particle-size distribution, the degree of precondensation, the condensation, wetting and drying behaviour and the printing behaviour, polymers for influencing the rheological properties (structural viscosity, thixotropy, flow point, etc.), particulate additives for influencing the rheological properties, particulate additives (for example aluminium hydroxides and aluminium oxides, silicon dioxide) for influencing the dry-film thicknesses resulting after drying, and the morphology thereof, particulate additives (for example aluminium hydroxides and aluminium oxides, silicon dioxide) for influencing the scratch resistance of the dried films, oxides, hydroxides, basic oxides, alkoxides and precondensed alkoxides of the elements selected from the group boron, gallium, silicon, germanium, zinc, tin, phosphorus, titanium, zirconium, yttrium, nickel, cobalt, iron, cerium, niobium, arsenic, lead and further compounds and mixtures thereof which are suitable for the formulation of corresponding hybrid sols, enabling all mixed forms resulting therefrom to be possible. In particular, these are simple and polymeric oxides, hydroxides, alkoxides of boron and phosphorus for the formulation of formulations which have a doping action on semiconductors, in particular on silicon layers.

In this connection, it goes without saying that each print-coating method makes its own requirements of the paste to be printed and/or of the paste resulting from a corresponding ink. Depending on the particular printing method, the individual parameters to be set for the paste relate to the surface tension, the viscosity and the total vapour pressure of the paste.

Apart from their use for the production of scratch-protection and corrosion-protection layers, for example in the production of components in the metal industry, the printable pastes can preferably be used in the electronics industry, and in particular here in the manufacture of microelectronic, photo-voltaic and microelectromechanical (MEMS) components. Photovoltaic components in this connection are taken to mean, in particular, solar cells and modules. Thus, the pastes according to the invention can be used for the manufacture of thin-film solar cells from thin-film solar modules, the production of organic solar cells, the production of printed circuits and organic electronics, the production of display elements based on the technologies of thin-film transistors (TFTs), liquid crystals (LCDs), organic light-emitting diodes (OLEDs) and contact-sensitive capacitive and resistive sensors.

The present invention thus also consists in the provision of printable, sterically stabilised pastes for the formation of $Al_2O_3$ coatings and also mixed $Al_2O_3$ hybrid layers.

Suitable hybrid materials are mixtures of $Al_2O_3$ with the oxides of the elements boron, gallium, silicon, germanium, zinc, tin, phosphorus, titanium, zirconium, yttrium, nickel, cobalt, iron, cerium, niobium, arsenic and lead, where the pastes are obtained by the introduction of the corresponding precursors into the paste. Steric stabilisation of the pastes is effected here by mixing with hydrophobic components, such as 1,3-cyclohexadione, salicylic acid and structural relatives, and moderately hydrophilic components, such as acetylacetone, dihydroxybenzoic acid, trihydroxybenzoic acid and structural relatives thereof, or with chelating agents, such as ethylenediamine-tetraacetic acid (EDTA), diethylenetriaminepentaacetic acid (DETPA), nitrilo-triacetic acid (NTA), ethylenediaminetetramethylenephosphonic acid (EDTPA), diethylenetriaminepentamethylenephosphonic acid (DETPPA) and structurally related complexing agents or chelating agents.

Solvents which can be employed in the pastes are mixtures of at least one low-boiling alcohol, preferably ethanol or isopropanol, and at least one high-boiling glycol ether, preferably diethylene glycol monoethyl ether, ethylene glycol monobutyl ether or diethylene glycol monobutyl ether, or a suitable pure glycol ether. However, other polar media, such as acetone, DMSO, sulfolane or ethyl acetate and the like, can also be used. The coating property can be matched to the substrate through its mixing ratio.

Addition of acids establishes an acidic pH in the pastes. The pastes for precondensation are therefore in an acidic medium (pH 4-5). The acids used for adjustment of the pH can be organic acids, preferably acetic acid, which result in residue-free drying.

For the formation of the desired impermeable, homogeneous layer, water for hydrolysis is added, where the molar ratio of water to precursor is between 1:1 and 1:9, preferably between 1:1.5 and 1:2.5.

In order to prepare the pastes according to the invention, the layer-forming components are employed in a ratio to one another such that the solids content of the pastes is between 9 and 10% by weight.

Suitable formulation of the compositions gives pastes having a storage stability of >3 months, where no detectable changes in the pastes with respect to viscosity, particle size or coating behaviour are detectable within this time.

The residue-free drying of the pastes after coating of the surfaces results in amorphous $Al_2O_3$ layers, where the drying is carried out at temperatures between 300 and 1000° C., preferably at about 350° C. On suitable coating, the drying takes place within <5 minutes. If the drying is carried out under so-called heat-treatment conditions above 1000° C., hard, crystalline layers form which have a comparable structure to corundum.

$Al_2O_3$ (hybrid) layers which have been dried at temperatures <500° C. can be etched using most inorganic mineral acids, but preferably using HF or $H_3PO_4$, but also by many organic acids, such as acetic acid, propionic acid and the like. Simple post-structuring of the layers obtained is thus possible.

Suitable substrates for the coating with the pastes according to the invention are mono- or multicrystalline silicon wafers (cleaned with HF or RCA), sapphire wafers, thin-film solar modules, glasses coated with functional materials (for example ITO, FTO, AZO, IZO or the like), uncoated glasses, steel elements and alloys, especially in the automobile sector, and other surfaces used in microelectronics.

In accordance with the substrates selected, the layers formed through the use of the pastes according to the invention can serve as diffusion barrier, printable dielectric, electronic and electrical passivation, antireflection coating, mechanical protection layer against wear, chemical protection layer against oxidation or the action of acid.

The pastes according to the invention which are described here can be deposited in a simple manner on semiconducting materials, preferably on silicon, and particularly preferably on silicon wafers, where they induce electronic surface passivation after corresponding treatment. This already increases the charge-carrier lifetime, i.e. after application of a thin layer of paste and subsequent drying. If not only drying, but also so-called heat treatment is carried out at a temperature in the range 350-550° C., either in an oxygen, oxygen/nitrogen, nitrogen or forming-gas stream (for example 5% v/v of $H_2$/95% v/v of $N_2$), the surface passivation of the underlying layer can be greatly increased.

Pastes according to the invention in the form of hybrid materials comprising simple and polymeric boron and phosphorus oxides and alkoxides thereof can be used for the inexpensive full-area and local doping of semiconductors, preferably silicon, especially in the electrical and electronics industry in general, and in the photovoltaics industry, in particular in the production of crystalline silicon solar cells and solar modules.

The pastes according to the invention are printable, and formulations and rheological properties thereof can be matched within broad limits to the needs necessary in each case of the printing method to be used. These pastes are preferably printed by means of flexographic and/or screen printing, particularly preferably by means of screen printing.

The pastes according to the invention in the form of hybrid sols comprising $Al_2O_3/B_2O_3$ can be employed for the specific doping of semiconductors, preferably of silicon wafers. Silicon wafers which can be employed for this purpose have preferably been cleaned with the RCA or an alternative comparable cleaning sequence. Suitable wafer surfaces may be in hydrophilically or hydrophobically terminated form. Simplified cleaning is preferably carried out before application of the $Al_2O_3$ layer; the wafers to be treated are preferably cleaned and etched by means of HF solutions. The layer remaining on the wafer after the doping process can be removed simply by means of etching in dilute HF.

$Al_2O_3$ layers produced in this way can be used as sodium and potassium diffusion barrier in LCD technology. A thin layer of $Al_2O_3$ on the cover glass of the display here can prevent diffusion of ions from the cover glass into the liquid-crystalline phase, enabling the lifetime of the LCDs to be increased considerably.

The present description enables the person skilled in the art to use the invention comprehensively. Even without further comments, it is therefore assumed that a person skilled in the art will be able to utilise the above description in the broadest scope.

If anything should be unclear, it goes without saying that the cited publications and patent literature should be consulted. Accordingly, these documents are regarded as part of the disclosure content of the present description.

For better understanding and in order to illustrate the invention, two examples are given below which are within the scope of protection of the present invention. These examples also serve to illustrate possible variants. Owing to the general validity of the inventive principle described, however, the examples are not suitable for reducing the scope of protection of the present application to these alone.

Furthermore, it goes without saying to the person skilled in the art that, both in the examples given and also in the remainder of the description, the component amounts present in the compositions always add up only to 100% by weight or 100 mol %, based on the composition as a whole, and cannot exceed this, even if higher values could arise from the per cent ranges indicated. Unless indicated otherwise, % data are regarded as % by weight or mol %, with the exception of ratios, which are given in volume data.

The temperatures given in the examples and description and in the Claims are always in ° C.

FIGURES AND DIAGRAMS

FIG. 1: Photomicrograph of a screen-printed $Al_2O_3$ layout after drying for 5 minutes at 300° C. (left) and after 10 minutes at 600° C. (right).

Figure 2:
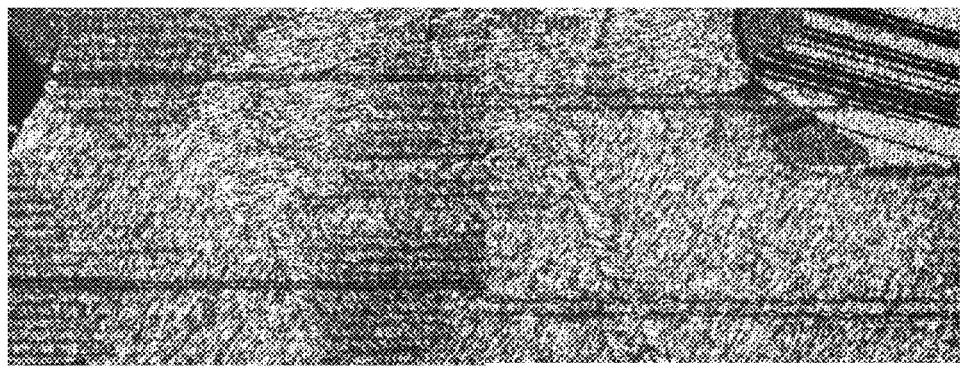

FIG. 2: Photomicrograph of an $Al_2O_3$ layout applied by screen printing after about 1000 pre-prints.

Figure 3:
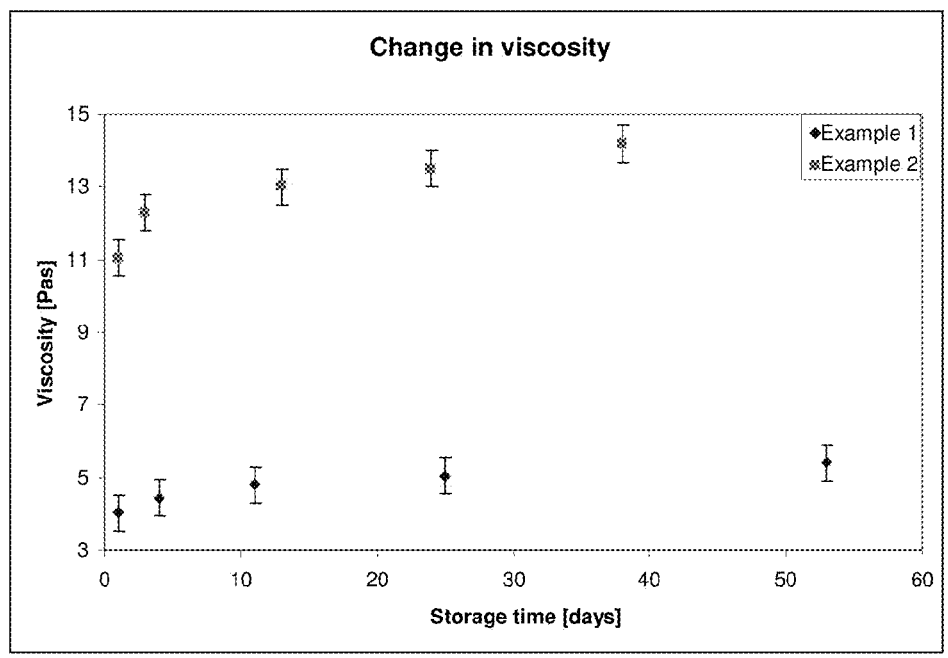

FIG. 3 Change in viscosity of screen-printable aluminium oxide pastes in accordance with Examples 1 and 2

Figure 4:
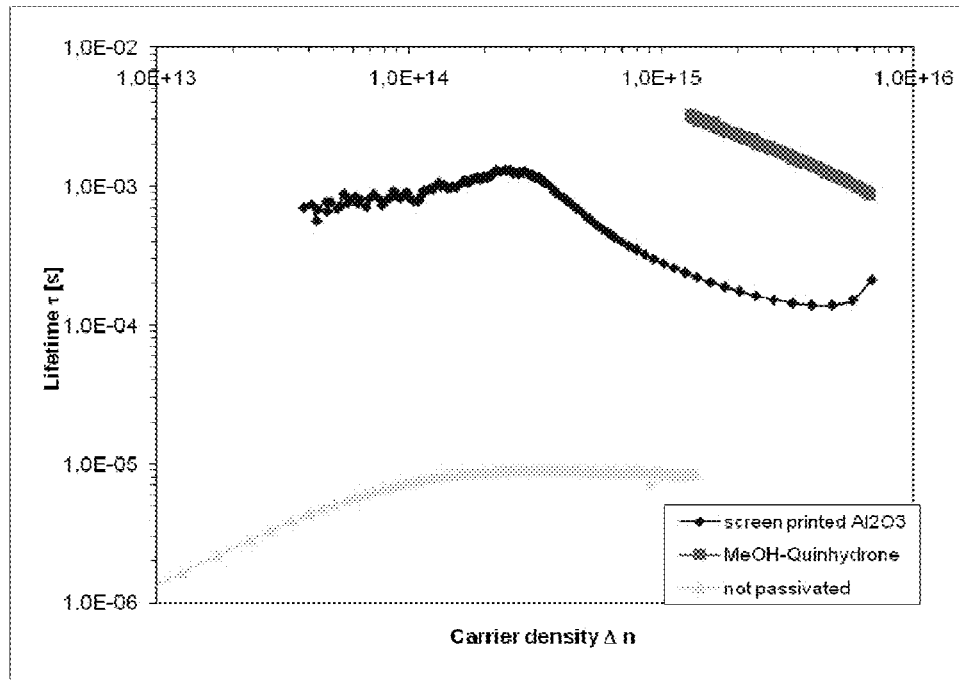

FIG. 4 Charge-carrier lifetimes of p-doped FZ wafer samples in accordance with Example 5

EXAMPLES

Example 1

4.6 g of salicylic acid and 1.7 g of acetylacetone in 22 ml of diethylene glycol monoethyl ether and 2 g of acetic acid are initially introduced in a 100 ml round-bottomed flask. 14.1 g of aluminium tri-sec-butoxide are added to the solution, and the mixture is stirred for 10 minutes. 2.8 g of water are added for hydrolysis of the partially protected aluminium alkoxide, and the yellow solution is stirred for 10 minutes and left to stand for one day for ageing. The liquid ink is evaporated in a rotary evaporator at a temperature of 50° C. and a pressure of 20 mPa and, after distillation of all the 2-butanol formed from the hydrolysis, kept under these conditions for a further 2 hours. The viscous mass obtained exhibits a viscosity of 4.3 Pas. The resolution of the layout applied by screen printing exhibits slight "bleeding" of the paste, causing a printed 100 µm line to be about 150 µm wide after drying.

Example 2

4.6 g of salicylic acid and 2.5 g of acetylacetone in 28 ml of diethylene glycol monoethyl ether and 1 g of acetic acid are initially introduced in a 100 ml round-bottomed flask. 21.4 g of aluminium tri-sec-butoxide are added to the solution, and the mixture is stirred for 10 minutes. 3.7 g of water are added for hydrolysis of the partially protected aluminium alkoxide, and the yellow solution is stirred for 10 minutes and left to stand for one day for ageing. The viscous ink is evaporated in a rotary evaporator at a temperature of 50° C. and a pressure of 20 mPa and, after distillation of all the 2-butanol formed from the hydrolysis, kept under these conditions for a further 2 hours. The viscous mass obtained exhibits a viscosity of 14 Pas.

Example 3

After cleaning with HF, a multicrystalline silicon wafer is printed with an aluminium oxide paste in accordance with Example 2 by means of screen printing. In order to simulate long-term print loading, about 1000 pre-prints are carried outwit the paste before the actual print. The paste exhibits very good resolution even after this long-term test.

FIG. 2 shows a photomicrograph of an $Al_2O_3$ layout applied by screen printing after about 1000 pre-prints. The very good resolution even after long-term printing is evident in both pictures (left printed 50 µm, after drying about 53 µm; right printed 100 µm, after drying about 105 µm).

Example 4

In order to be able to assess the stability of the paste, the viscosity is investigated over a period of at least 6 weeks. FIG. 3 shows the change in viscosity of a paste in accordance with Examples 1 and 2.

From the viscosity curve, it can be seen that the paste thickens somewhat, especially within the first days after the synthesis, but the viscosity changes only little in the remainder of the storage time (<2% after 3 days). The viscosity can be re-set at any time by addition of a small amount of solvent.

Example 5

After cleaning, a p-doped (100) FZ silicon wafer piece polished on both sides is printed on both sides with an aluminium oxide sol paste in accordance with Examples 1 and 2 by means of screen printing, and each printed side is dried in each case at 450° C. for 30 minutes on a hotplate. The print layout consists of a square with an edge length of 4 cm. The charge-carrier lifetime of the wafer is subsequently investigated by means of a WCT-120 photoconductance lifetime tester (QSSPC, quasi steady-state photoconductance; measurement window 3 cm). The references used are identical wafer samples which are either uncoated or have been treated with the aid of the wet-chemical quinhydrone/methanol process. The quinhydrone/methanol process (mixture of 1,4-benzoquinone, 1,4-benzohydroquinone and methanol) is a wet-chemical and temporarily effective, i.e. non-long-term-stable, electronic surface passivation. All wafer samples are etched (pre-cleaned) in advance by means of dilute HF.

FIG. 4 shows charge-carrier lifetimes of p-doped FZ wafer samples graphically: uncoated sample (yellow, bottom), sample coated with aluminium oxide (blue, middle) and chemically passivated sample (magenta, top). The lifetimes are, in this sequence (injection density: 1E+15 $cm^{-3}$, equals carrier density): 8 µs, 275 µs and >>3000 µs.

An increase in the lifetime by a factor of ~34 is determined compared with the uncoated sample. The increase in the carrier lifetime is at tributable to the action of the aluminium oxide as electronic surface passivation of the semi-conducting material.

It should be noted in this context that the sample is dried exclusively under ambient conditions. An increase in the carrier lifetime can be expected after treatment of the sample in either an oxygen, oxygen/nitrogen, nitrogen or forming-gas atmosphere (for example in 5% v/v of nH2/95% v/v of N2). Furthermore, edge effects and influences cannot be excluded in the passivation action, and an influence of potential flaws in the front and back coatings cannot be excluded.

The invention claimed is:

1. A printable, sterically stabilized paste suitable for the formation of a diffusion-impermeable homogeneous $Al_2O_3$ coating or a mixed $Al_2O_3$ hybrid layer, comprising
   a precursor for the formation of $Al_2O_3$ and
   one or more oxides of the elements selected from the group consisting of boron, gallium, silicon, germanium, zinc, tin, phosphorus, titanium, zirconium, yttrium, nickel, cobalt, iron, cerium, niobium, arsenic and lead, and
   at least one hydrophobic component selected from the group consisting of 1,3-cyclohexadione and salicylic acid and
   at least one hydrophilic component selected from the group consisting of acetylacetone, dihydroxybenzoic acid and trihydroxybenzoic acid and
   one or more organic acids and
   optionally at least one chelating agent selected from the group consisting of ethylenediaminetetraacetic acid (EDTA), diethylenetriaminepentaacetic acid (DETPA), nitrilotriacetic acid (NTA), ethylenediaminetetramethylenephosphonic acid (EDTPA), diethylenetriaminepentamethylenephosphonic acid (DETPPA), and corresponding chelating agents,
   wherein said paste has an acidic pH of 4-5 and results in residue-free drying.

2. A paste according to claim 1, which is obtained by the introduction of the corresponding precursor into the paste.

3. A paste according to claim 1, which comprises at least one chelating agent.

4. A paste according to claim 1, which comprises
   at least one hydrophobic component selected from the group consisting of 1,3-cyclohexadione and salicylic acid, and
   at least one hydrophilic compound selected from the group consisting of acetylacetone, dihydroxybenzoic acid and trihydroxybenzoic acid, and
   optionally at least one chelating agent selected from the group consisting of ethylenediaminetetraacetic acid (EDTA), diethylenetriaminepentaacetic acid (DETPA), nitrilotriacetic acid (NTA), ethylenediaminetetramethylenephosphonic acid (EDTPA), and diethylenetriaminepentamethylenephosphonic acid (DETPPA).

5. A paste according to claim 1, further comprising a solvent selected from the group consisting of ethanol, isopropanol, diethylene glycol monoethyl ether, ethylene glycol monobutyl ether, diethylene glycol monobutyl ether, polar solvents, acetone, DMSO, sulfolane and ethyl acetate.

6. A paste according to claim 1, further comprising water for hydrolysis in the molar ratio of water to precursor in the range of 1:1 to 1:9, where the solids content is in the range of 9 to 10% by weight.

7. A diffusion barrier, a printed dielectric, electronic or electrical passivation, an antireflection coating, a mechanical protection layer against wear, a chemical protection layer against oxidation or the action of acid, which has been prepared from a paste according to claim 1.

8. A hybrid material that contains simple and polymeric boron and phosphorus oxides and alkoxides thereof, which has been prepared from a paste according to claim 1.

9. An $Al_2O_3$ layer as a sodium and potassium diffusion barrier in LCD technology, which has been prepared from a paste according to claim 1.

10. A process for preparing a pure, residue-free, amorphous $Al_2O_3$ layer on a product, which is a mono- or multicrystalline silicon wafer, sapphire wafer, thin-film solar module, a glass coated with a functional material, which is optionally ITO, FTO, AZO, IZO or the like, an uncoated glass, a steel element or alloy, or a material for microelectronics, comprising applying a paste according to claim 1 to said product and drying at a temperature of 300 to 1000° C.

11. A process according to claim 10, wherein the drying is carried out over the course of less than 5 minutes, giving a layer having a thickness of less than 100 nm.

12. A process according to claim 10 for the production of pure, residue-free, amorphous, structurable $Al_2O_3$ layer, wherein the drying is carried out at a temperature X, wherein $300°$ C.$<X<500°$ C.

13. A process according to claim 12, further comprising structuring the layer by HF, $H_3PO_4$, an organic acid, acetic acid or propionic acid.

14. A process for preparing a pure, residue-free, amorphous $Al_2O_3$ layer on a product, which is a mono- or multicrystalline silicon wafer, sapphire wafer, thin-film solar module, a glass coated with a functional material, which is optionally ITO, FTO, AZO, IZO or the like, an uncoated glass, a steel element or alloy, or a material for microelectronics, comprising applying a paste according to claim 1 to said product and drying at a temperature above 1000° C., wherein a hard, crystalline layer having comparable properties to corundum is formed.

15. A method for a full-area or local doping of a semiconductor or silicon, comprising applying to said semiconductor or silicon a hybrid material that contains simple and polymeric boron and phosphorus oxides and alkoxides thereof, which has been prepared from a paste according to claim 1.

16. An method for forming an $Al_2O_3$ layer as a sodium and potassium diffusion barrier barriers in LCD technology, comprising applying a paste according to claim 1 to form said barrier.

17. A printable, sterically stabilized paste suitable for the formation of a diffusion-impermeable homogeneous $Al_2O_3$ coating or a mixed $Al_2O_3$ hybrid layer, comprising
   a precursor for the formation of $Al_2O_3$ and
   one or more oxides of the elements selected from the group consisting of boron, gallium, silicon, germanium, zinc, tin, phosphorus, titanium, zirconium, yttrium, nickel, cobalt, iron, cerium, niobium, arsenic and lead, and
   at least one hydrophobic component selected from the group consisting of 1,3-cyclohexadione and salicylic acid and
   at least one hydrophilic component selected from the group consisting of acetylacetone, dihydroxybenzoic acid and trihydroxybenzoic acid and
   one or more organic acids and
   optionally at least one chelating agent selected from the group consisting of ethylenediaminetetraacetic acid (EDTA), diethylenetriaminepentaacetic acid (DETPA), nitrilotriacetic acid (NTA), ethylenediaminetetramethylenephosphonic acid (EDTPA), diethylenetriaminepentamethylenephosphonic acid (DETPPA), and corresponding chelating agents, wherein said paste has an acidic pH of 4-5 and results in residue-free drying and wherein said paste does not contain corrosive anions $NO_3^-$.

18. A paste according to claim 17, further comprising water for hydrolysis in the molar ratio of water to precursor in the range of 1:1 to 1:9, where the solids content is in the range of 9 to 10% by weight.

19. A paste according to claim 17, which comprises at least one chelating agent.

20. A paste according to claim 17, further comprising a solvent selected from the group consisting of ethanol, isopropanol, diethylene glycol monoethyl ether, ethylene glycol monobutyl ether, diethylene glycol monobutyl ether, polar solvents, acetone, DMSO, sulfolane and ethyl acetate.

* * * * *